United States Patent
Bedell et al.

(10) Patent No.: US 9,741,532 B1
(45) Date of Patent: Aug. 22, 2017

(54) MULTI-BEAM ELECTRON MICROSCOPE FOR ELECTRON CHANNELING CONTRAST IMAGING OF SEMICONDUCTOR MATERIAL

(71) Applicant: International Business Machines Corporation, Armonk, NY (US)

(72) Inventors: Stephen W. Bedell, Wappingers Falls, NY (US); Kunal Mukherjee, White Plains, NY (US); John A. Ott, Greenwood Lake, NY (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/185,920

(22) Filed: Jun. 17, 2016

(51) Int. Cl.
| | |
|---|---|
| *H01J 37/28* | (2006.01) |
| *H01J 37/26* | (2006.01) |
| *H01J 37/20* | (2006.01) |
| *H01J 37/244* | (2006.01) |
| *H01J 37/06* | (2006.01) |
| *H01J 37/21* | (2006.01) |

(52) U.S. Cl.
CPC .............. *H01J 37/28* (2013.01); *H01J 37/06* (2013.01); *H01J 37/20* (2013.01); *H01J 37/21* (2013.01); *H01J 37/244* (2013.01); *H01J 37/263* (2013.01); *H01J 2237/0245* (2013.01); *H01J 2237/202* (2013.01); *H01J 2237/2804* (2013.01); *H01J 2237/2813* (2013.01)

(58) Field of Classification Search
USPC ......................................... 250/306, 307, 310
See application file for complete search history.

(56) References Cited

U.S. PATENT DOCUMENTS

| 7,935,926 B2 * | 5/2011 | Kim ..................... G02F 1/1303 |
| | | 250/310 |
| 2003/0085353 A1 * | 5/2003 | Almogy .................. H01J 37/28 |
| | | 250/310 |

OTHER PUBLICATIONS

Hafner, B., "Scanning Electron Microscopy Primer", Characterization Facility, University of Minnesota, Twin Cities, Apr. 16, 2007, pp. 1-29.

* cited by examiner

*Primary Examiner* — Kiet T Nguyen
(74) *Attorney, Agent, or Firm* — Scully, Scott, Murphy & Presser, P.C.; Louis J. Percello, Esq.

(57) ABSTRACT

A multi-beam electron microscope for ECCI is provided. The electron microscope has a platform, on which a crystalline sample is placed. At least a first electron source and a second electron source of the electron microscope are mounted to a housing. The housing is tiltable with respect to a longitudinal direction through a pivot for forming a fulcrum, such that the first electron source and the second electron source are tilted simultaneously and are substantially equally distanced from the platform along a vertical axis when the housing is tilted. The electron microscope also has electron beam focusing assemblies for focusing the electron beams generated by the electron sources onto the crystalline sample to generate backscattered electrons. The electron microscope also has detectors for detecting the backscattered electrons.

20 Claims, 5 Drawing Sheets

MULTI-BEAM ELECTRON MICROSCOPE FOR ELECTRON CHANNELING CONTRAST IMAGING OF SEMICONDUCTOR MATERIAL

BACKGROUND

The present disclosure and embodiments thereof are in the field of electron channeling contrast imaging of a crystalline material as commonly used in research labs. More particularly, the present disclosure relates to a multi-beam electron microscope used to create electron channeling contrast images of the crystalline material for the purpose of detecting crystalline defects within the material.

In manufacturing of microelectronics, defects in the crystalline quality of the material can adversely affect the material quality. As materials (such as, Ge, SiGe and/or III-V compound) are added into the manufacturing line, defects caused by the epitaxy and processing of dissimilar materials are more abundant than with silicon only technologies. Therefore, it is important to test the defect density and other properties in the materials to control the growth and processing in the line.

Most of the conventional techniques used for such defect detection are destructive, since they require cutting, polishing and/or thinning of the sample being tested. Although there are some non-destructive techniques for defect detection, such techniques are limited. For example, known non-destructive techniques have low throughput, which hinders the ability of the known non-destructive techniques for providing accurate and efficient defect detection.

Accordingly, there exists a need in the art to overcome the deficiencies and limitations described hereinabove with respect to the conventional non-destructive technique for detection of defects in various crystalline materials used in the semiconductor industry.

SUMMARY

In one aspect of the present application, an electron microscope used for creating electron channeling contrast images of a crystalline sample is provided. The electron microscope includes a platform on which the crystalline sample is placed. The electron microscope further includes at least a first electron source and a second electron source. The first electron source generates a first electron beam and the second electron source generates a second electron beam. The first electron source and the second electron source are distanced from the platform along a vertical axis. The electron microscope further includes a first electron beam focusing assembly configured to focus the first electron beam onto and scan the first electron beam over the crystalline sample and a second electron beam focusing assembly configured to focus the second electron beam onto and scan the second electron beam over the crystalline sample, such that the first electron beam interacts with the crystalline sample to generate first backscattered electrons and the second electron beam interacts with the crystalline sample to generate second backscattered electrons. The electron microscope further includes at least a first detector and a second detector. The first detector is configured to detect the first backscattered electrons and the second detector is configured to detect the second backscattered electrons. The first detector is associated with the first electron source to move simultaneously with the first electron source and the second detector is associated with the second electron source to move simultaneously with the second electron source. The electron microscope also includes a housing to which the first electron source and the second electron source are mounted. The housing is provided with a pivot for forming a fulcrum. The housing is tiltable along the fulcrum with respect to a longitudinal axis that extends from the first electron source to the second electron source and is substantially perpendicular to the vertical axis. The first electron source and the second electron source are tilted simultaneously and are substantially equally distanced from the platform along the vertical axis when the housing is tilted.

In another aspect of the present application, a method for creating electron channeling contrast images of a crystalline sample by using an electron microscope is provided. The method includes placing the crystalline sample on a platform and tilting at least a first electron source and a second electron source simultaneously. The first electron source and the second electron source are distanced from the platform along a vertical axis. The first electron source and the second electron source are tiltable with respect to a longitudinal axis, which extends from the first electron source to the second electron and is substantially perpendicular to the vertical axis. The first electron source and the second electron source are substantially equally distanced from the platform along the vertical axis when the first electron source and the second electron source are being tilted. The method further includes generating a first electron beam by using the first electron source. The method further also includes focusing the first electron beam onto and scanning the first electron beam over the crystalline sample by using a first electron beam focusing assembly to generate first backscattered electrons through interaction between the first electron beam and the crystalline sample. The method additionally includes detecting the first backscattered electrons by using a first detector that is connected to the first electron source to move simultaneously with the first electron source.

DETAILED DESCRIPTION OF EMBODIMENTS

Figure 1:
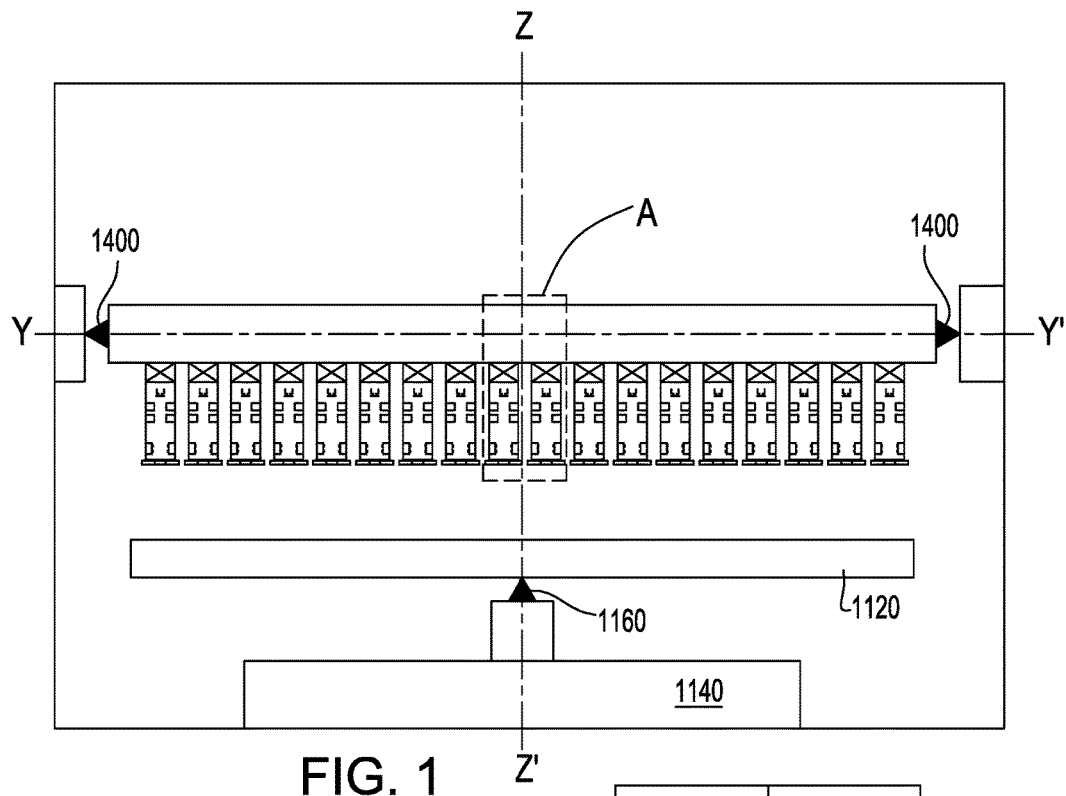
FIG. 1 is a schematic front view of a multi-beam electron microscope used for creating electron channeling contrast images of a crystalline sample, according to an exemplary embodiment of the present disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

Detailed embodiments of the methods and apparatuses of the present disclosure are described herein; however, it is to be understood that the disclosed embodiments are merely illustrative of the disclosed methods and apparatuses that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 is a schematic front view of a multi-beam electron microscope 1000 used for creating electron channeling contrast images of a crystalline sample commonly used in the semiconductor industry, according to an exemplary embodiment of the present disclosure. The electron microscope 1000 can be a scanning electron microscope (SEM), a reflection electron microscope (REM) or any suitable electron microscope that is capable of generating signals that can be used to characterize the topography, composition, microstructure and/or material contrast of the crystalline sample by scanning focused electron beams across the sample. For example, signals can be low-energy secondary electrons, high-energy backscattered electrons, Auger electrons, cathodoluminescence and/or X-rays, which can be detected by suitable detectors. In this embodiment, the electron microscope 1000 will be described with respect to an SEM, in which high-energy backscattered electrons are generated and detected for the purpose of conducting electron scanning channeling contrast imaging (ECCI) of the crystalline sample. However, it should be understood that the disclosure is not limited to an SEM, but is rather contemplated to encompass other types of electron microscopes.

Of Significant importance to ECCI is that the electron beam must be substantially aligned to the crystal plains within the crystalline sample. This means that most of the electrons interact with the crystal in a specific way. Typically, most of the electrons will channel into the crystal, such that there will be very few electrons that are reflected or backscattered. In contrast, in a crystalline sample with defects, the defects comprise the crystal structure, such that the electrons will not interact in the same way with the defects as the rest of the perfect crystal. With the right imaging conditions, this means that there are many electrons that are reflected or backscattered to the detector. As a result, the image the backscatter detector has a significant contrast from the defect channeling or lack thereof.

In order to increase the contrast and see the images the electron beams ought to be aligned with the crystal structure of the sample. The multi-beam electron microscope 1000 is designed for this task, the details of which will be described as follows.

The electron microscope 1000 includes an enclosure 1200. The enclosure 1200 provides a space, in which the electrical, mechanical and optical components of the electron microscope can be accommodated. Typically, the enclosure is maintained in vacuum, for example, to avoid undesirable interference of the molecules of the air with the electron beams. The enclosure 1200 can be tubular, rectangular or cone-shaped, or of any suitable profile and shape.

A platform 1120 is provided in the enclosure 1200. A semiconductor sample can be placed on and move together with the platform. The platform 1120 can be moved (such as, translated, rotated and/or tilted) in any direction to change the position and/or orientation of the sample, such that the sample can be properly aligned with the incident electron beams during operation. The movement of the platform 1120 can be effected by a motorized stage 1140. A pivot 1160 can be further included to permit pivoting of the platform 1120 as necessary.

Figure 1A:
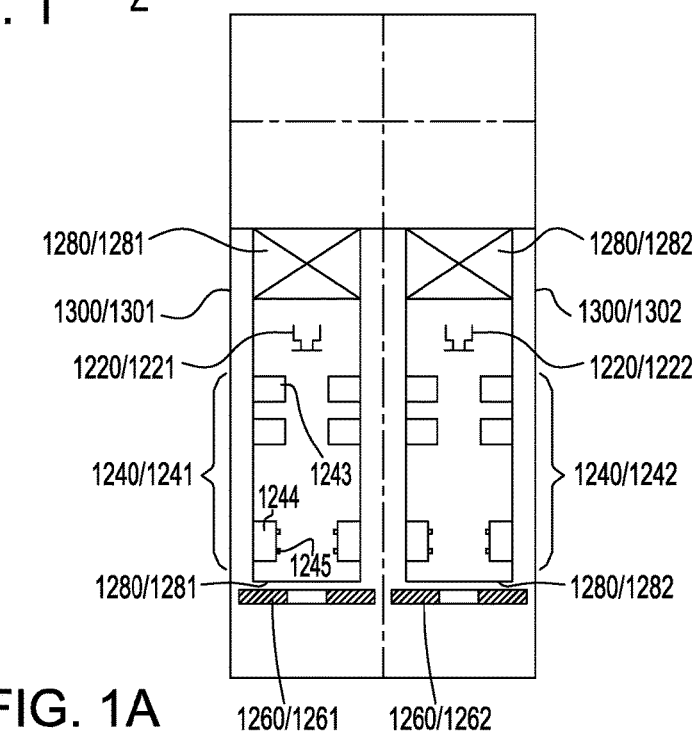
FIG. 1A is an enlarged view of a portion A of FIG. 1.

The electron microscope 1000 further includes a plurality of electron sources 1220, which can be electron guns. The plurality of electron sources 1220 includes at least a first electron source 1221 and a second electron source 1222, which are shown in FIG. 1A that is an enlarged view of the portion A of FIG. 1. The plurality of electron sources 1220 can have any suitable number of electron sources, which number is equal to or greater than two. Each electron source is configured to generate an electron beam, which can be subsequently adjusted by a respective electron beam focusing assembly and focused onto a top surface of the crystalline sample placed on the platform 1120. The provision of multiple electron sources can effectively increase brightness (i.e., a relatively high current of electrons in the beam) for imaging the crystalline sample, in contrast to an assembly where a single source is split up into multiple beams. Increased electron brightness is desirable for conducting electron scanning channeling contrast imaging (ECCI) of a crystalline sample. As shown in FIG. 1, the plurality of electron sources 1220 are distanced from the platform 1120 in a vertical direction (as indicated by a vertical axis ZZ' shown in FIG. 1), and the electron beams generated by the plurality of electron sources 1220 travel in the space between the plurality of electron sources 1220 and the crystalline sample placed on the platform 1120. Since the contrast difference between the electrons that are backscattered from the perfect crystals and the defects is typically not high, higher brightness electron sources are used to achieve a significant signal to noise ratio.

The electron microscope 1000 further includes a plurality of electron beam focusing assemblies 1240, each corresponding to a respective electron source. The plurality of electron beam focusing assemblies 1240 can have any suitable number of electron beam focusing assemblies, which number is equal to or greater than two. As shown in FIG. 1A, the plurality of electron beam focusing assemblies 1240 includes at least a first electron beam focusing assembly 1241 that is optically coupled to the first electron source 1221 and a second electron beam focusing assembly 1242 that is optically coupled to the second electron source 1222.

According to one embodiment, the first electron beam focusing assembly 1241 includes one or more electrostatic lenses (not shown), which facilitate forming the electron beams and are disposed optically downstream of the electron sources 1220. The first electron beam focusing assembly 1241 can also include one or more condenser lenses 1243 that are disposed optically downstream of the electrostatic lenses. The first electron beam focusing assembly 1241 further includes one or more objective lenses 1244 and one or more deflection coils 1245 associated with the objective lenses 1244, respectively. According to another embodiment, the condenser lenses 1243 are removed to reduce the size of electron beam focusing assembly, without compromising the performance of the electron microscope 1000 for the specific task for which the microscope is designed. The second electron beam focusing assembly 1242 can be the same as or similar to the first electron beam focusing assembly 1241. When the electron microscope 1000 is in use, the electron beams generated by the plurality of electron sources 1220 are processed by their respective electron beam focusing assemblies 1240 to allow the electron beams to be eventually focused onto the top surface of the crystalline sample placed on the platform 1120. In certain embodiments, a limited number (1-2) of distinct magnifications in the low magnification range (10×-100× magnification) and a limited number (1-2) of distinct magnifications in the high magnification range (5,000×-50,000× magnification) are needed. As a result, the optics of the electron microscope can be simplified and minimized to work specifically for ECCI imaging. In contrast, a conventional SEM requires a large range at variable magnifications throughout many orders of magnitude, for provide a general purpose microscope. This can results in making the individual electron beam focusing assemblies 1240 physically smaller so that more sources can be included in a smaller area.

The electron beams, after being focused onto the crystalline sample, interact with the crystalline sample to generate signals that can be later detected using suitable detectors. For example, the electron beams can interact with the crystalline sample to generate respective backscattered electrons and a backscatter electron detector is used to detect these electrons. Images are later produced by processing the signals from the detectors (for example, by using computers, processors, circuits and/or algorithms that are run by the computers, processors, circuits) for conducting electron scanning channeling contrast imaging (ECCI) of the crystalline sample backscatter electron signals and detectors are typically used, but any signals and detectors can be used that produce a contrast when crystalline defects are present in the crystal.

The electron microscope 1000 further includes a plurality of detectors 1260, each corresponding to a respective electron source 1220 and a respective electron beam focusing assembly 1240. The plurality of detectors 1260 can have any suitable number of detectors, which number is equal to or greater than two. As shown in FIG. 1A, the plurality detectors 1260 includes a first detector 1261, which is provided on a bottom surface 1281 of the first electron beam focusing assembly 1241, and a second detector 1262, which is provided on a bottom surface 1282 of the second electron beam focusing assembly 1242. Each of the detectors is configured to detect and/or receive the signals generated by the interaction between the electron beams and the crystalline sample. For example, the detectors can be high angle energy filter backscatter detectors and the detectors should be selected to highlight the contrast created by the defects in the crystalline sample in an optimal manner. The vertical distance between the top surface of the crystalline sample and detectors 1260 can be adjusted by moving the platform 1120 and/or the combination of the electron sources, the electron beam focusing assemblies and the detectors vertically. In the shown embodiment, the detectors can be energy filtered backscatter detectors. The energy filtered backscatter detectors measure the reflected or backscattered electrons. The energy filtered backscatter detectors also filter out the electrons by energy, because the electrons that are reflected will have a specific energy range and the other electrons (i.e. the noise) will not have the same energy.

According to another embodiment, each combination of a respective electron sources, a respective electron beam focusing assembly and a respective detector can be integrated to a housing 1300. As shown in FIG. 1A, the housing 1300 includes a first housing 1301, to which the first electron source 1221, the first electron beam focusing assembly 1241 and the first detector 1621 are integrated. The housing 1300 also includes a second housing 1302, to which the second electron source 1222, the second electron beam focusing assembly 1242 and the second detector 1622 are integrated. Alternatively, the housing 1300 can be a single housing, to which all the electron sources, electron beam focusing assemblies and detectors are mounted.

Figure 2:
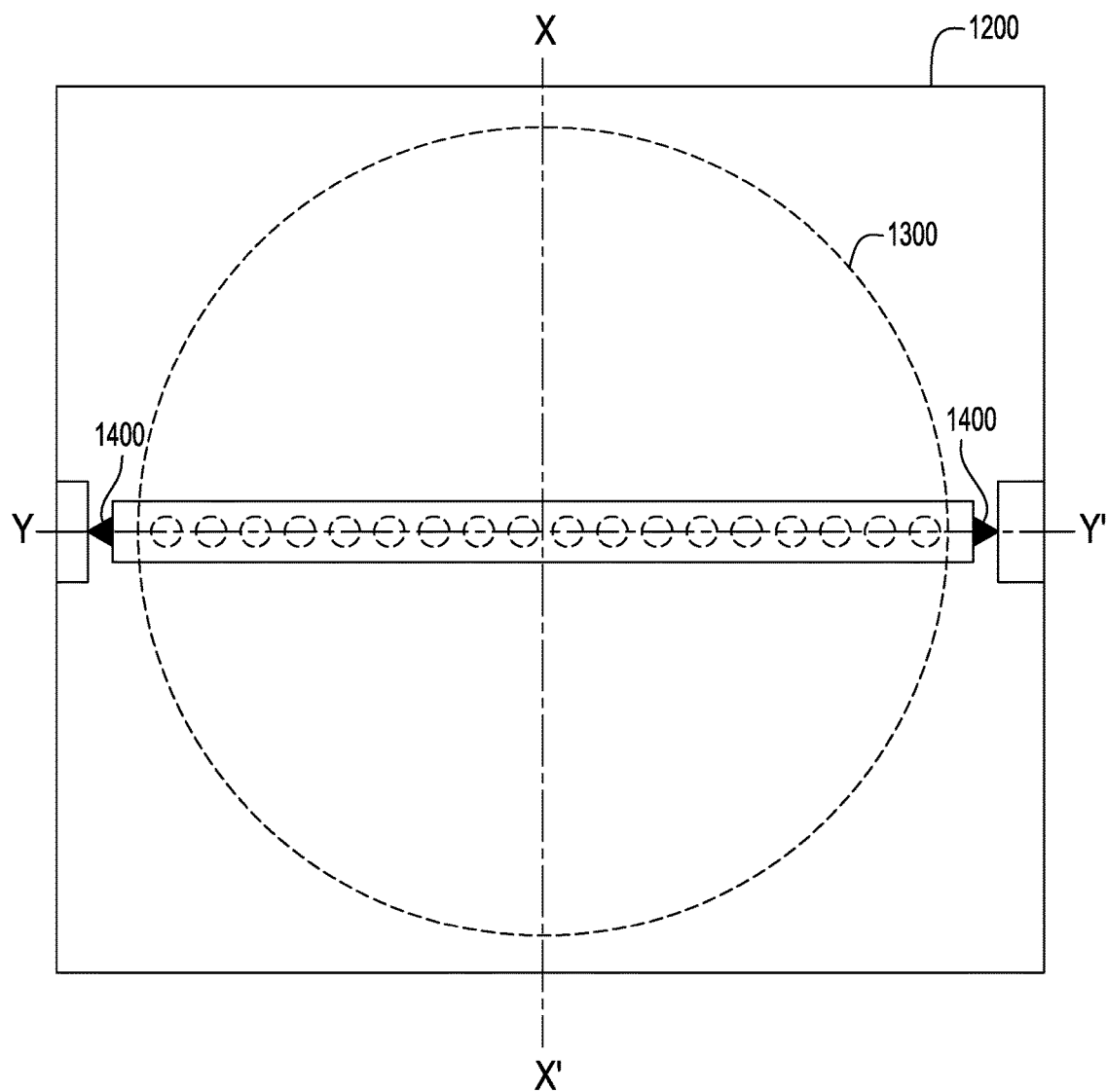
FIG. 2 is a schematic top view of the electron microscope of FIG. 1.
Figure 3:
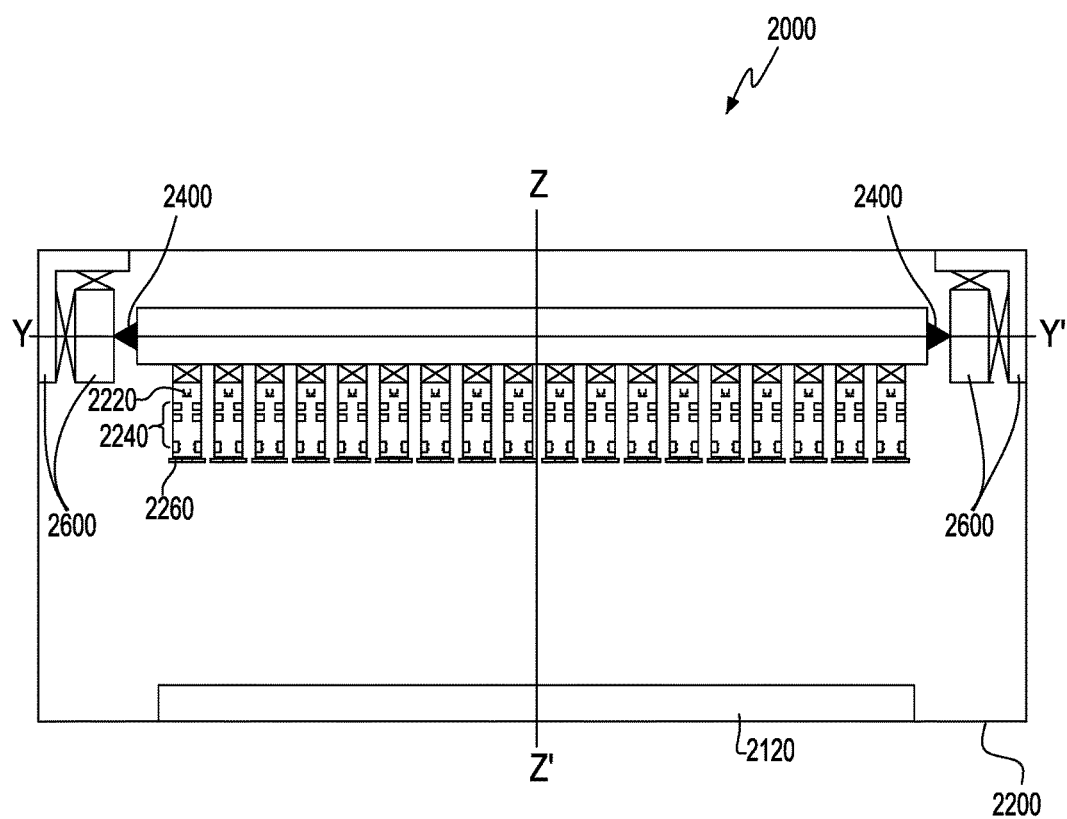
FIG. 3 is a schematic front view of a multi-beam electron microscope, according to another exemplary embodiment of the present disclosure.

As shown in FIGS. 1 and 2, according to one embodiment of the present disclosure, the plurality of electron sources 1220 are mounted in a one dimensional array arrangement, such that the vertical distance between each electron source and the top surface of the crystalline sample can be maintained substantially the same. For example, the housing 1300, to which the electron sources 1220 are mounted, can be attached to a pivot 1400 for forming a fulcrum, through which the housing 1300 is tiltable with respect to a longitudinal axis YY' that is substantially perpendicular to the vertical axis ZZ'. The longitudinal axis YY' can substantially extend through the plurality of electron sources 1220. In operation, the housing 1300 can be tilted to simultaneously tilt the electron sources 1220, the electron beam focusing assemblies 1240 and the detectors 1260, to selectively scan the top surface of the crystalline sample. At the same time, the platform 1120 can move the crystalline sample in the vertical direction, the longitudinal direction and a transverse direction (i.e., along a transverse axis XX') that is perpendicular to both the vertical direction and the longitudinal direction. The platform 1120 can also rotate with respect to the vertical axis ZZ', for example, in a range of at least −2 degrees to 2 degrees. However, the rotation of the platform with respect to the vertical axis ZZ' can be up to 360 degrees. As a result, for each specific section of the crystalline sample having a specific structure and composition, the distance between the sample and the electron sources/detectors and the orientation of the sample with respect to the electron sources/detectors can be optimized, such that an optimal imaging and observation of the specific section can be achieved to analyze the specific structure and composition.

Moreover, as the electron sources, the electron beam focusing assemblies and the detectors are tiltable with respect to the crystalline sample, the necessity of the titling movement of the platform 1120 can be avoided during operation, which allows the enclosure 1200 to be minimized, for example, in the vertical direction. In addition, since the crystalline sample is typically flat and placed on the platform 1120 that is typically a portion of a conveyor, the elimination of the tilting of the sample is advantageous in improving the operational efficiency of the microscope. However, a skilled person in the art understands that the sample can be optionally tilted with the platform 1120 through the pivot 1160, when it is necessary.

A mechanical alignment structure 1280 can be provided to each combination of respective electron source, electron beam focusing assembly and detector, for independently tuning the mechanical alignment of an electron beam with respect to an adjacent electron beam, such that both electron beams are substantially perpendicular to the top surface of the crystalline sample simultaneously. Alternatively, all the mechanical alignment structures can be used collectively for tuning the mechanical alignment of any two or more adjacent electron sources, such that all the electron sources are substantially perpendicular to the top surface of the crystalline sample simultaneously. The mechanical alignment structure can be, for example, a mechanical stepper motor or a piezoelectric device.

In the above-described embodiment, the plurality of electron sources 1220 are provided in a linear manner to the housing 1300 and the plurality of detectors 1260 are also provided in a liner manner to the bottom surface 1280 of the housing 1300. As a result of the linearity of the components, all electron sources can remain substantially equally distanced from the platform along the vertical axis when they are being tilted. However, a skilled person in the art understand that other suitable arrangement of the electron sources and/or detectors can also be applied, without departing from the essence of the present disclosure.

According to the electron microscope 1000, multiple electron sources and respective detectors are provided, which can increase the number of images obtained for implementing ECCI. In addition, the density of the electron sources can be increased by minimizing the dimensions of the electron sources, for example, by eliminating the condenser lenses. As a result, the throughput of the ECCI can be improved. For example, in one application, imagining an area of 1 cm$^2$ at a 4 nm resolution is desired. With 50 simultaneous beams imaging the surface, the imaging process may take approximately 6 hours, but with 100 beams, the imaging would only take 3 hours.

A mechanical or electrical controller can be provided along the beam path within the electron beam focusing assemblies 1240, which can selectively turn on or turn off the operation of an individual electron source. For example, the controller can be used to sequentially turn on or turn off the electron sources. Alternatively, the controller can be used to turn on the electron sources designated by odd numbers for imaging, while turning off the electron sources designated by even numbers, and vice versa. The selective control of the electron sources can prevent or minimize the interferences between any two adjacent electron source and detector pairs. According to another embodiment, in order to prevent or minimize the interferences, one or more shields can be provided between the adjacent electron source and detector pairs. According to yet another embodiment, the distance between two adjacent electron source and detector pairs are pre-calculated to prevent or minimize the interferences.

Figure 4:
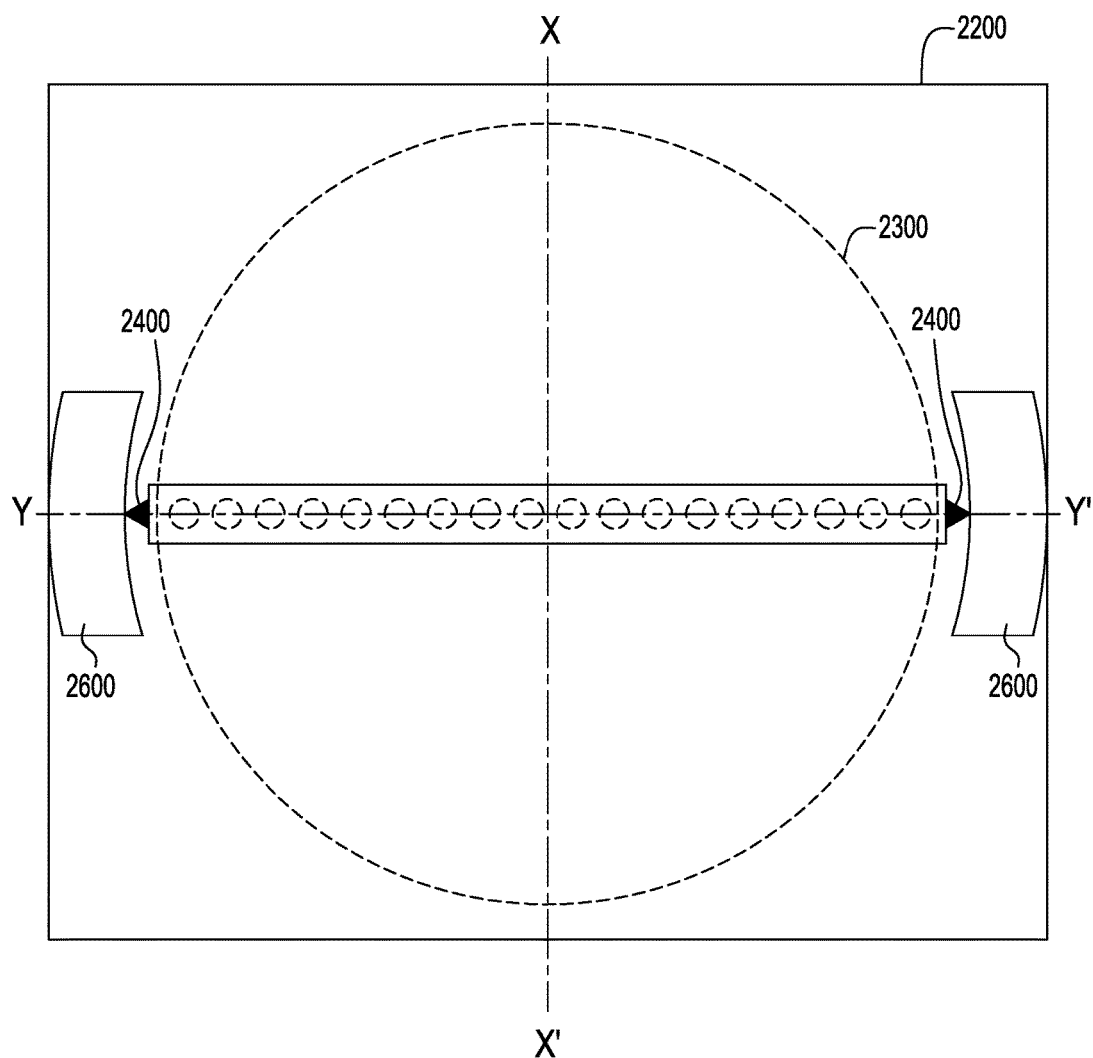
FIG. 4 is a schematic top view of the electron microscope of FIG. 3.
Figure 5:
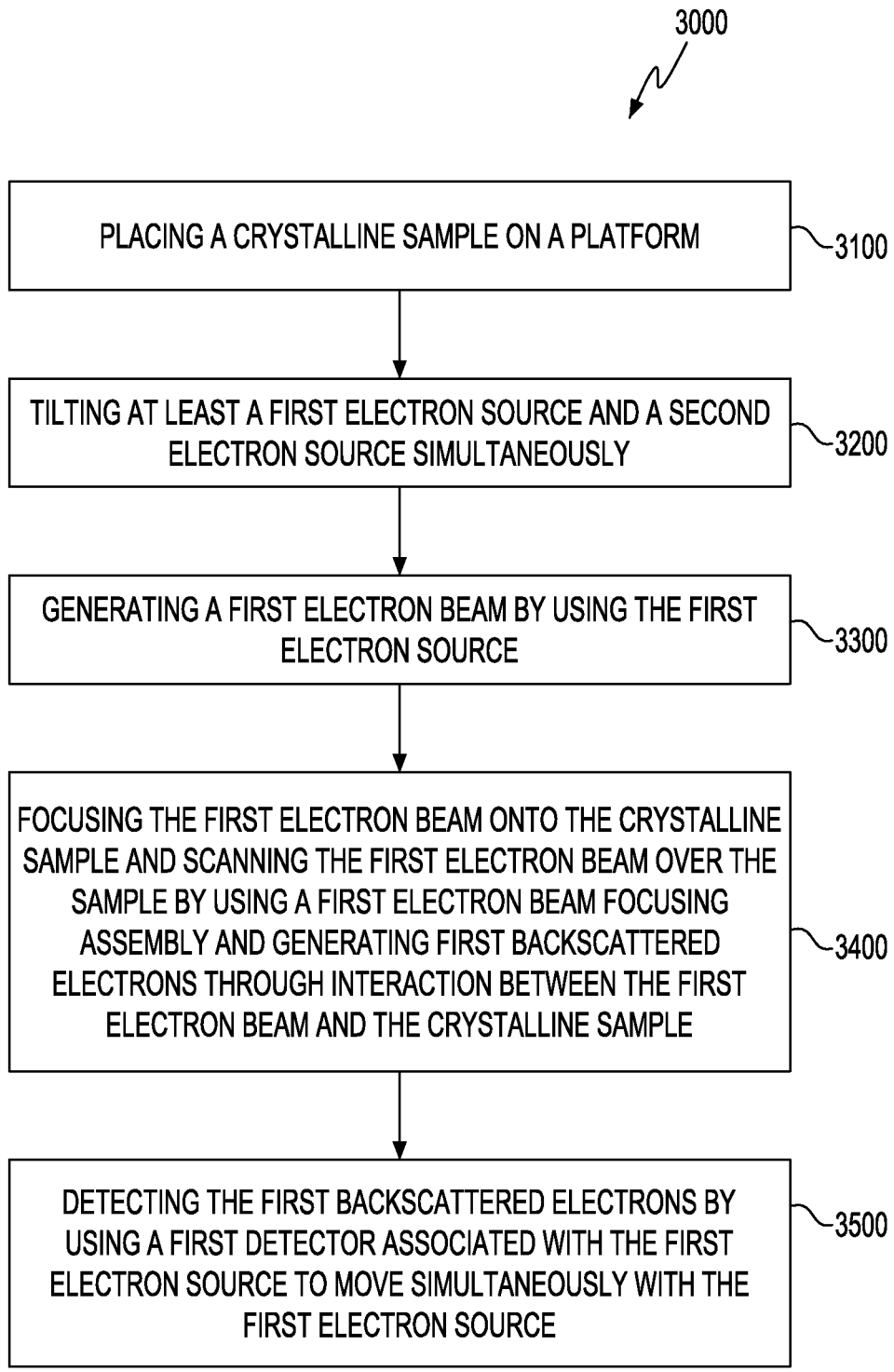
FIG. 5 is a flow chart showing a method according to still another exemplary embodiment of the present disclosure.

FIGS. 4 and 5 depict a multi-beam electron microscope 2000, according to another exemplary embodiment of the present disclosure. The multi-beam electron microscope 2000 includes a platform 2120, on which the crystalline sample can be placed to move with the platform. The multi-beam electron microscope 2000 also includes an enclosure 2200, in which all the electrical, mechanical and optical components of the microscope can be accommodated. The multi-beam electron microscope 2000 further includes a housing 2300, to which a plurality of electron sources 2220, a plurality of electron beam focusing assemblies 2240 and a plurality of detectors 2260 are mounted. The electron sources, electron beam focusing assemblies and detectors can be the same as or similar to those of the multi-beam electron microscope 1000 as previously described. Thus, for brevity purpose, the detailed description of the electron sources, electron beam focusing assemblies and detectors are omitted herein.

The electron microscope 2000 further includes a pivot 2400 for forming a fulcrum, through which the housing 2300 is tiltable with respect to the longitudinal axis YY' that is substantially perpendicular to the vertical axis ZZ'. According to this embodiment, the housing 2300 is also movable in the longitudinal direction along the longitudinal axis YY' and in the vertical direction along the vertical axis ZZ'. The housing 2300 is also rotatable with respect to the vertical axis ZZ', for example, in a range of at least −2 degrees to 2 degrees. However, the rotation of the housing 2300 with respect to the vertical axis ZZ' can be up to 360 degrees. The movement and rotation of the housing 2300 can be effected through an actuator 2600, which can mechanically, electrically or magnetically actuate the housing 2300. According to this embodiment, due to the movement and rotation of the housing 2300, the movement of the crystalline sample can be further simplified to achieve the advantages that is the same as or similar to that of the previous embodiment. In this regard, the platform 2120 only needs to move in the transverse direction along the XX' axis, during the operation of the electron microscope 2000, which can improve the efficiency of the conveyor. In addition, the tilting of the platform 2120 can also be optionally eliminated. As a result, for each specific section of the crystalline sample having a specific structure and composition, the distance between the sample and the electron sources/detectors and the orientation of the sample with respect to the electron sources/detectors can be optimized, such that an optimal imaging and observation of the specific section can be achieved to analyze the sample.

The electron microscope 2000 can also includes a plurality of mechanical alignment structures 2280, which can the same as the mechanical alignment structures 1280 of the previous embodiment.

In accordance with the above-described embodiments, the housing pivots on a single fulcrum, such that all the beams can be aligned with crystal of the sample simultaneously. For ECCI, tilt increments between 0.1 and 0.01 degree are desirable. During operation, the rotation of the sample with respect to the ZZ' axis can be rotated to align with beams in the proper crystal directions. In according with the above-described embodiments, movement of the sample along the XX' axis and the YY' axis allows imaging the surface of the entire sample area. The adjustment of the sample along the ZZ' axis facilitates to position the surface of the sample at the right height for the optics, such that the beams can be focused on the sample and the signal can be transmitted to the detectors. The tilting of the housing and electron sources around the fulcrum and rotation of the housing and electron sources allow the beams to be aligned with the crystal planes of the sample.

In addition, additional instruments and detectors can be added to assist with the alignment of the electron beam to the crystalline planes of the sample as discussed above. For example, electron backscatter diffraction (EBSD) detectors and x-ray diffraction sources and detectors can be used to assist in fine tuning the alignment of the crystal to the electron beams.

According to another aspect of the disclosure, a method 3000 is provided. The method 3000 is used for electron channeling contrast imaging a crystalline sample, by using an electron microscope. The electron microscope can be the electron microscope 1000 or 2000, as previously described.

In step 3100, the crystalline sample is placed on a platform (which can be the platform 1120 or 2120), such that the crystalline sample can be moved (translated, rotated and/or tilted) together with the platform.

In step 3200, at least a first electron source and a second electron source are tilted, simultaneously and collectively, with respect to the longitudinal axis. The first electron source and the second electron source can be any two of the electron sources 1220 or 2220. The first electron source and the second electron source are substantially equally distanced from the platform along the vertical axis when being tilted.

In step 3300, a first electron beam is generated by the first electron source. Optionally, a second electron beam can be generated by the second electron source. The second electron beam can be generated simultaneously with or separately from the first electron beam. Optionally, three or more electron beams can be generated by three or more electron sources, respectively, and the electron beams can be generated simultaneously with or separately from each other.

In step 3400, the first electron beam is focused onto the crystalline sample by a first electron beam focusing assembly, such that a first signal is generated by the interaction between the first electron beam and the crystalline sample. The first signal can be first backscattered electrons. Optionally, the second electron beam can be focused onto the crystalline sample by a second electron beam focusing assembly, such that a second signal is generated by the interaction between the second electron beam and the crystalline sample. The second signal can be second backscattered electrons. Optionally, three or more signals can be generated by focusing the electron beams onto the crystalline sample to enable interactions between the electron beams and the crystalline sample.

In step 3500, the first signal (such as, the first backscattered electrons) is detected by a first detector associated with the first electron source. Both the first detector and the first electron source can be mounted to a housing of the electron microscope to move simultaneously. Optionally, the second signal (such as, the second backscattered electrons) is detected by a second detector that is associated with the second electron source and moves simultaneously with the second electron source. The above steps 3200-3500 are not necessarily sequential, and can be repeated when needed.

Optionally, when the first electron source and the second electron source are being tilted simultaneously with respect to the longitudinal axis, the crystalline sample can be moved by the platform along the vertical axis, the longitudinal axis and/or the transverse axis. Optionally, when the first electron source and the second electron source are being tilted simultaneously with respect to the longitudinal axis, the crystalline sample can be rotated by the platform with respect to the vertical axis in a range from at least −2 degrees to 2 degrees. However, the sample and the platform can be rotated with respect to the vertical axis up to 360 degrees.

Optionally, when the first electron source and the second electron source are being tilted simultaneously with respect to the longitudinal axis, the sample and the platform can be moved along the longitudinal direction. Optionally, when the first electron source and the second electron source are being tilted simultaneously with respect to the longitudinal axis, the first electron source and the second electron source can be moved (for example, by moving the housing) along the vertical axis and the transverse axis; and the first electron source and the second electron source can be rotated (for example, by rotating the housing) with respect to the vertical axis in a range of at least −2 degrees to 2 degrees. However, the first electron source, the second electron source and the housing are rotatable with respect to the vertical axis up to 360 degrees.

Optionally, the mechanical alignment of the first electron source with the second electron source can be tuned by using a first mechanical alignment structure mounted to the first electron source, such that both sources are substantially perpendicular to a top surface of the crystalline sample simultaneously. Optionally, the mechanical alignment of the second electron source with the first electron source can also be independently tuned by using a second mechanical alignment structure mounted to the second electron source, such that both sources are substantially perpendicular to the top surface of the crystalline sample simultaneously.

Optionally, the first electron beam is focused onto and scanned over the crystalline sample, by using the first electron beam focusing assembly that includes electrostatic lenses, condenser lenses, objective lenses and deflection coils associated with the objective lenses, respectively. Optionally, the second electron beam is focused onto and scanned over the crystalline sample, by using the second electron beam focusing assembly that includes electrostatic lenses, condenser lenses, objective lenses and deflection coils associated with the objective lenses, respectively.

Optionally, the first electron beam is focused onto and scanned over the crystalline sample, by using the first electron beam focusing assembly that includes electrostatic lenses, objective lenses and deflection coils associated with the objective lenses, respectively. Optionally, the second electron beam is focused onto the crystalline sample by using the second electron beam focusing assembly that includes electrostatic lenses, objective lenses and deflection coils associated with the objective lenses, respectively.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A scanning electron microscope used for creating electron channeling contrast images of a crystalline sample, the scanning electron microscope comprising:

a platform on which the crystalline sample is placed;

at least a first electron source and a second electron source, wherein the first electron source generates a first electron beam and the second electron source generates a second electron beam, wherein the first electron source and the second electron source are distanced from the platform along a vertical axis;

a first electron beam focusing assembly configured to focus the first electron beam onto and scan the first electron beam over the crystalline sample and a second electron beam focusing assembly configured to focus the second electron beam onto and scan the second electron beam over the crystalline sample, such that the first electron beam interacts with the crystalline sample to generate first backscattered electrons and the second electron beam interacts with the crystalline sample to generate second backscattered electrons;

at least a first detector and a second detector, wherein the first detector is configured to detect the first backscattered electrons and the second detector is configured to detect the second backscattered electrons, wherein the first detector is associated with the first electron source to move simultaneously with the first electron source and the second detector is associated with the second electron source to move simultaneously with the second electron source; and a housing to which the first electron source and the second electron source are mounted, wherein the housing comprising a pivot for providing a fulcrum, wherein the housing is tiltable along the fulcrum with respect to a longitudinal axis, said longitudinal axis extending from the first electron source to the second electron source and being substantially perpendicular to the vertical axis;

wherein the first electron source and the second electron source are tilted simultaneously and are substantially equally distanced from the platform along the vertical axis when the housing is tilted.

2. The electron microscope according to claim 1, wherein the electron beam focusing assemblies comprise electrostatic lenses, condenser lenses, objective lenses and deflection coils associated with the objective lenses, respectively.

3. The electron microscope according to claim 1, wherein the electron beam focusing assemblies comprise electrostatic lenses, objective lenses and deflection coils associated with the objective lenses, respectively.

4. The electron microscope according to claim 1,
wherein the first electron source and the second electron source are mounted to the housing in a linear manner; and
wherein the first detector is mounted to a bottom surface of the first beam focusing assembly and the second detector is mounted to a bottom surface of the second beam focusing assembly.

5. The electron microscope according to claim 1, wherein the platform is moveable along the vertical axis, along the longitudinal axis and along a transverse axis that is substantially perpendicular to both the longitudinal axis and the vertical axis.

6. The electron microscope according to claim 5, wherein the platform is rotatable with respect to the vertical axis in a range from at least −2 degrees to 2 degrees and is rotatable with respect to the vertical axis up to 360 degrees.

7. The electron microscope according to claim 1, wherein the platform is moveable along a transverse axis that is substantially perpendicular to both the longitudinal axis and the vertical axis.

8. The electron microscope according to claim 7,
wherein the housing is movable along the vertical axis and along the longitudinal axis; and
wherein the housing is rotatable with respect to the vertical axis in a range from at least −2 degrees to 2 degrees and is rotatable with respect to the vertical axis up to 360 degrees.

9. The electron microscope according to claim 1, further comprising:
a first mechanical alignment structure provided to the first electron source for tuning the mechanical alignment of the first electron source with respect to the second electron source, such that both the first electron beam and the second electron beam are substantially perpendicular to a top surface of the crystalline sample simultaneously; and
a second mechanical alignment structure provided to the second electron source for independently tuning the mechanical alignment of the second electron source with respect to the first electron source, such that both the first electron beam and the second electron beam are substantially perpendicular to the top surface of the crystalline sample simultaneously.

10. The electron microscope according to claim 9, wherein the first mechanical alignment structure and the second mechanical alignment structure are selected from a group consisting of a mechanical stepper motor and a piezoelectric device.

11. A method of creating electron channeling contrast images of a crystalline sample by using an electron microscope, the method comprising:
placing the crystalline sample on a platform;
tilting at least a first electron source and a second electron source simultaneously,
wherein the first electron source and the second electron source are distanced from the platform along a vertical axis,
wherein the first electron source and the second electron source are tiltable with respect to a longitudinal axis, said longitudinal axis extending from the first electron source to the second electron and being substantially perpendicular to the vertical axis, and
wherein the first electron source and the second electron source are substantially equally distanced from the platform along the vertical axis when the first electron source and the second electron source are being tilted;
generating a first electron beam by using the first electron source;
focusing the first electron beam onto and scanning the first electron beam over the crystalline sample by using a first electron beam focusing assembly to generate first backscattered electrons through interaction between the first electron beam and the crystalline sample; and
detecting the first backscattered electrons by using a first detector, wherein the first detector is associated with the first electron source to move simultaneously with the first electron source.

12. The method according to claim 11, further comprising:
generating a second electron beam by using the second electron source;
focusing the second electron beam onto and scanning the second electron beam over the crystalline sample by using a second electron beam focusing assembly to generate second backscattered electrons through interaction between the second electron beam and the crystalline sample; and
detecting the second backscattered electrons by using a second detector, wherein the second detector is associated with the second electron source to move simultaneously with the second electron source.

13. The method according to claim 11, further comprising moving the platform along the vertical axis, along the longitudinal axis and along a transverse axis that is substantially perpendicular to both the longitudinal axis and the vertical axis.

14. The method according to claim 13, further comprising rotating the platform with respect to the vertical axis in a range from at least −2 degrees to 2 degrees and is rotatable with respect to the vertical axis up to 360 degrees.

15. The method according to claim 11, further comprising moving the platform along a transverse axis that is substantially perpendicular to both the longitudinal axis and the vertical axis.

16. The method according to claim 15, further comprising:
moving a housing, to which the first electron source and the second electron source are mounted, along the vertical axis and along the longitudinal axis; and rotating the housing by a fulcrum with respect to the vertical axis in a range of at least −2 degrees to 2 degrees, wherein the housing is rotatable up to 360 degrees.

17. The method according to claim 11, further comprising tuning a mechanical alignment of the first electron source with the second electron source by using a first mechanical alignment structure mounted to the first electron source, such that the first electron beam and the second electron beam are substantially perpendicular to a top surface of the crystalline sample simultaneously.

18. The method according to claim 17, further comprising tuning a mechanical alignment of the second electron source with the first electron source by using a second mechanical alignment structure mounted to the second electron source, such that the first electron beam and the second electron beam are substantially perpendicular to the top surface of the crystalline sample simultaneously.

19. The method according to claim 11, wherein the focusing the first electron beam onto the crystalline sample by using the first electron beam focusing assembly comprises focusing the first electron beam onto the crystalline sample by using electrostatic lenses, condenser lenses, objective lenses and deflection coils associated with the objective lenses, respectively.

20. The method according to claim 11, wherein the focusing the first electron beam onto the crystalline sample by using the first electron beam focusing assembly comprises focusing the first electron beam onto the crystalline sample by using electrostatic lenses, objective lenses and deflection coils associated with the objective lenses, respectively.

\* \* \* \* \*